United States Patent [19]

Dinger

[11] 4,379,244

[45] Apr. 5, 1983

[54] METHOD OF DETECTION OF THE ASYMMETRY OF PIEZO-ELECTRIC CRYSTAL RESONATORS IN THE FORM OF TUNING FORKS AND RESONATORS FOR CARRYING IT OUT

[75] Inventor: Rudolf J. Dinger, St. Aubin, Switzerland

[73] Assignee: Ebauches, S.A., Switzerland

[21] Appl. No.: 181,715

[22] Filed: Oct. 10, 1980

[30] Foreign Application Priority Data

Aug. 31, 1979 [FR] France ................... 79 21864

[51] Int. Cl.$^3$ ............................................. H01L 41/08
[52] U.S. Cl. .................................... 310/312; 310/366; 310/370; 29/25.35
[58] Field of Search ....................... 310/370, 366, 312; 29/25.35

[56] References Cited

U.S. PATENT DOCUMENTS

| | | | |
|---|---|---|---|
| 3,683,213 | 8/1972 | Staudte | 310/370 X |
| 3,697,766 | 10/1972 | Ganter et al. | 310/366 X |
| 4,004,166 | 1/1977 | Nakata | 310/312 |
| 4,173,726 | 11/1979 | Hanji | 310/370 X |

FOREIGN PATENT DOCUMENTS

| | | | |
|---|---|---|---|
| 2913798 | 10/1979 | Fed. Rep. of Germany | 310/370 |
| 52-61986 | 5/1977 | Japan | 310/370 |
| 54-12287 | 1/1979 | Japan | 310/370 |
| 54-99587 | 8/1979 | Japan | 310/370 |

*Primary Examiner*—Mark O. Budd
*Attorney, Agent, or Firm*—Allegretti, Newitt, Witcoff & McAndrews, Ltd.

[57] ABSTRACT

The invention relates to a piezo-electric crystal reasonator comprising a tuning fork having two tines, one on each side of an axis of symmetry, having in addition to the excitation electrodes formed on the tines, auxiliary electrodes comprising conductive coatings formed, with the same axis of symmetry, on the same crystal which interconnects the two tines and further relates to a method for making such tuning fork resonator including the detection of asymmetry by applying an excitation voltage to the excitation electrodes to cause the resonator to oscillate, and while it is oscillating, detecting a voltage appearing between the auxiliary electrodes to indicate asymmetrical oscillation of the tines.

In addition to excitation electrodes (5, 6, 7) on the tines (2, 3) of the tuning fork, auxiliary conductive electrodes (17, 18, 19, 21) are formed on a part of the resonator which interconnects the two tines. The resonator is then caused to oscillate by applying an excitation voltage to said excitation electrodes and, while it is oscillating, the voltage appearing between the auxiliary electrodes in the event of an asymmetrical oscillation of the tines is detected.

Any asymmetry between the two tines can thus be detected and corrected in the course of the manufacture of the tuning fork.

5 Claims, 5 Drawing Figures

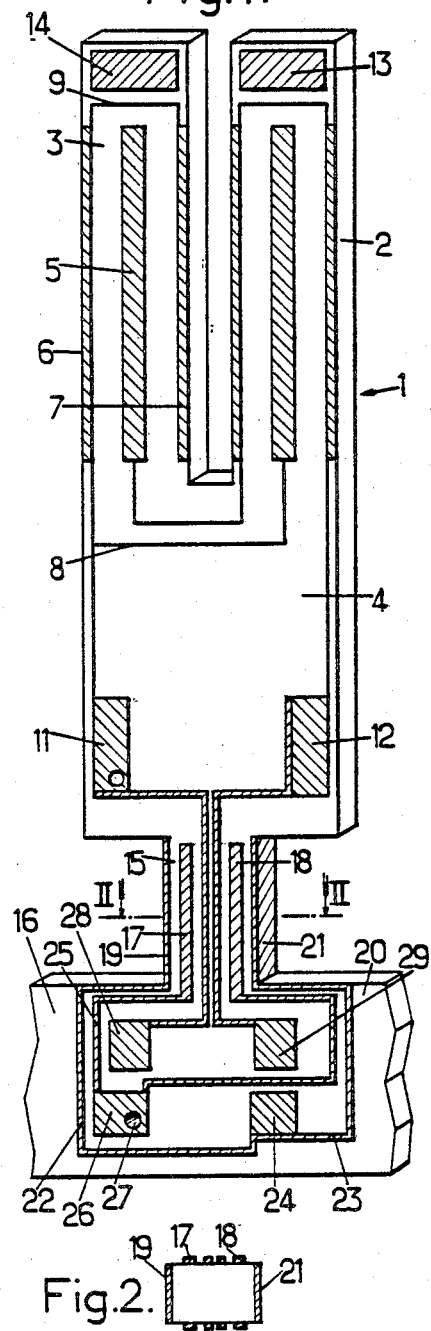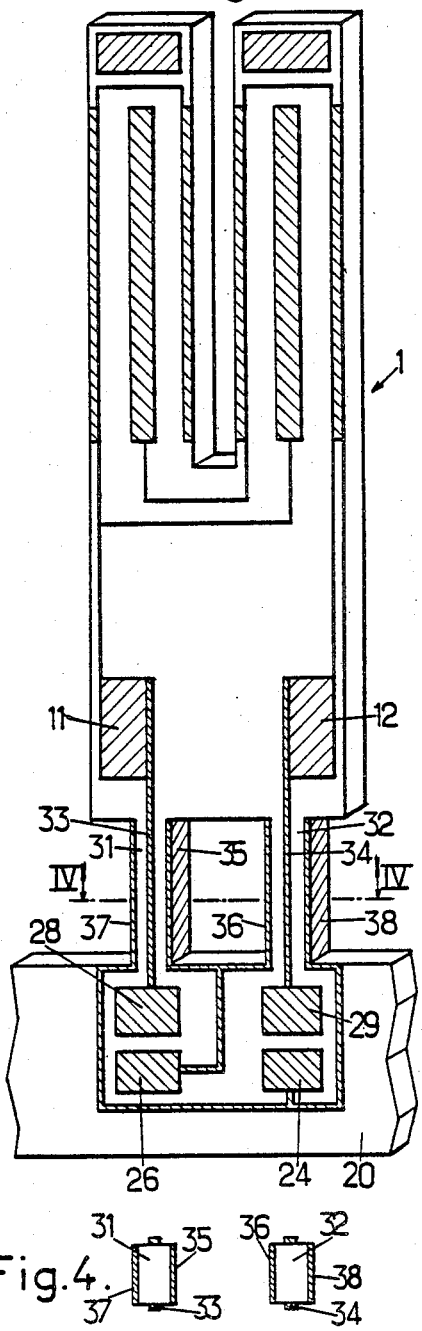

METHOD OF DETECTION OF THE ASYMMETRY OF PIEZO-ELECTRIC CRYSTAL RESONATORS IN THE FORM OF TUNING FORKS AND RESONATORS FOR CARRYING IT OUT

BACKGROUND OF THE INVENTION

The present invention relates to piezo-electric crystal resonators in the form of a tuning fork, their manufacture and the test of their properties.

Resonators of the tuning fork type are constituted by a piezo-electric crystal, nearly always of quartz, which carries excitation electrodes on two parallel tines formed in the crystal, one on each side of an axis of symmetry. Such a crystal in the form of a tuning fork is cut in a conventional manner substantially in its X-Y plane, the tines being perpendicular to the X axis and forming an angle (angle of cut) with the Y axis. The application of an electrical field parallel to the X axis enables the tuning fork to be set in oscillation by the symmetrical flexure of the tines in their plane and enables these oscillations to be maintained at the natural frequency of the tuning fork. The performance of these resonators is closely connected with the respective masses of the two tines and with the symmetry of their deformation. Hence, it is of interest to detect possible asymmetry.

In order to detect the asymmetry, the invention proposes to detect the oscillations which are transmitted within the body of the crystal, beyond the tines, when there is not equilibrium between the deformations of one tine and those of the other tine and to make this detection by also causing a piezo-electric effect to occur in this region.

BRIEF SUMMARY OF THE INVENTION

The invention has for its object a method of detecting the asymmetry in a piezo-electric crystal resonator in the form of a tuning fork with two tines, one on each side of an axis of symmetry, characterized in that, in addition to excitation electrodes on said tines, auxiliary conductive electrodes are formed with the same axis of symmetry, on a part of the crystal interconnecting the two tines. The resonator is then caused to oscillate by applying an excitation voltage to said excitation electrodes and, while it is oscillating, the piezo-electric voltage appearing between the auxiliary electrodes in the event of an asymmetrical oscillation of the tines is detected.

The detection of the asymmetry by this method advantageously takes place during the manufacture of the resonators, in order to correct all asymmetry thus detected by selectively altering the mass of one of the tines of the tuning fork. The alteration of mass can be effected by any of the techniques which are conventional per se and are of the kind which are applied, while simultaneously acting upon the tines, in order to adjust the natural frequency of the resonator to a given value. The most usual procedure is by reducing the mass of a metallic deposit formed specially for this purpose on the ends of the tines, this deposit being attacked, for example, by the action of a laser beam. Another technique consists in adding to the mass by vacuum evaporation. The attack by a laser beam is preferred since it has the advantage that it offers better possibilities of automation.

The correction of asymmetry may, in particular, be effected during a first coarse adjustment of the frequency.

In one embodiment of carrying out the method according to the invention, for the production of resonators of the tuning fork type, including a detection of asymmetry as has already been defined, the phase difference between the voltage detected at the terminals of the auxiliary electrodes of a resonator and the excitation voltage is also determined. From this phase difference, it is possible to deduce the direction of the resultant flexure in the region of the auxiliary electrodes, and hence it is possible to know which of the two tines has the greater mass. Consequently, it is possible to make use of the measured voltage to control the selective removal of material from one of the tines as a function of the phase difference so determined, so as to correct the asymmetry, action being taken more particularly at the level of controlling a laser beam which enables a metallic deposit on the branches of the resonator to be attacked.

It is also known that, in the industrial production of tuning fork type resonators, it is customary to manufacture a series of resonators by chemical attack of one and the same crystal plate, leaving said resonators connected by respective stems to a common base, throughout the whole of the operations of depositing conductive coatings forming the excitation electrodes and their supply leads and also generally during the adjustment of the frequency by removal of material from the tines. The auxiliary electrodes which, according to the invention, serve for the detection of the asymmetry may advantageously be formed on different faces of these stems, which are later broken for separating the individual resonators.

The invention covers resonators so formed which have, on at least one stem, cut in one and the same crystal and connecting them to a base which as a rule is common to several resonators, auxiliary electrodes on at least one face of said stem. The greatest sensitivity is obtained with a disposition which is symmetrical with respect to the axis of symmetry of the tuning fork, or more precisely to its plane of symmetry, and the auxiliary electrodes are advantageously so arranged that the voltage measured at the terminals of the auxiliary electrodes is particularly responsive to deflections of the stem in the plane of the tuning fork.

In one particular illustrative embodiment, the single stem of the resonator is disposed axially and carries on the main surfaces of the resonator auxiliary electrodes which are electrically connected together and, on the lateral surfaces of the stem, other auxiliary electrodes which are electrically connected together. The two groups of auxiliary electrodes are separately connected to contact areas formed on said base for the detection of the asymmetry voltage. In another illustrative embodiment, each resonator comprises two symmetrical stems carrying auxiliary electrodes on their two lateral surfaces, and the asymmetry voltage is detected between, on one hand, the electrodes on the internal mutually confronting surfaces which are interconnected and, on the other hand, the electrodes on the external surfaces which likewise are interconnected. The same stems may also carry, in a manner known per se, supply leads for temporarily supplying the excitation electrodes of the resonators from other contact areas formed on the base.

It will be understood that the scope of the invention extends equally to installations for the production of resonators which comprise means for carrying out the detection of asymmetry, including preferably the utilization thereof for the correction of defects in symmetry during the process of manufacture according to the invention.

BRIEF DESCRIPTION OF THE DRAWINGS

The invention will now be more completely described with reference to particular embodiments thereof selected by way of illustrative, non-limiting examples. The description refers to FIGS. 1 to 5 of the accompanying drawings, in which:

FIG. 1 shows a first illustrative embodiment of a resonator in the course of its manufacture, as viewed towards one of its main surfaces, FIG. 2 is a section taken on the line II—II in FIG. 1 of the stem of this resonator, FIG. 3 shows a second illustrative embodiment of a resonator in the course of its manufacture, FIG. 4 is a section taken on the line IV—IV in FIG. 3 of the stems of this resonator.

DETAILED DESCRIPTION OF THE PREFERRED EMBODIMENT

Figure 5:
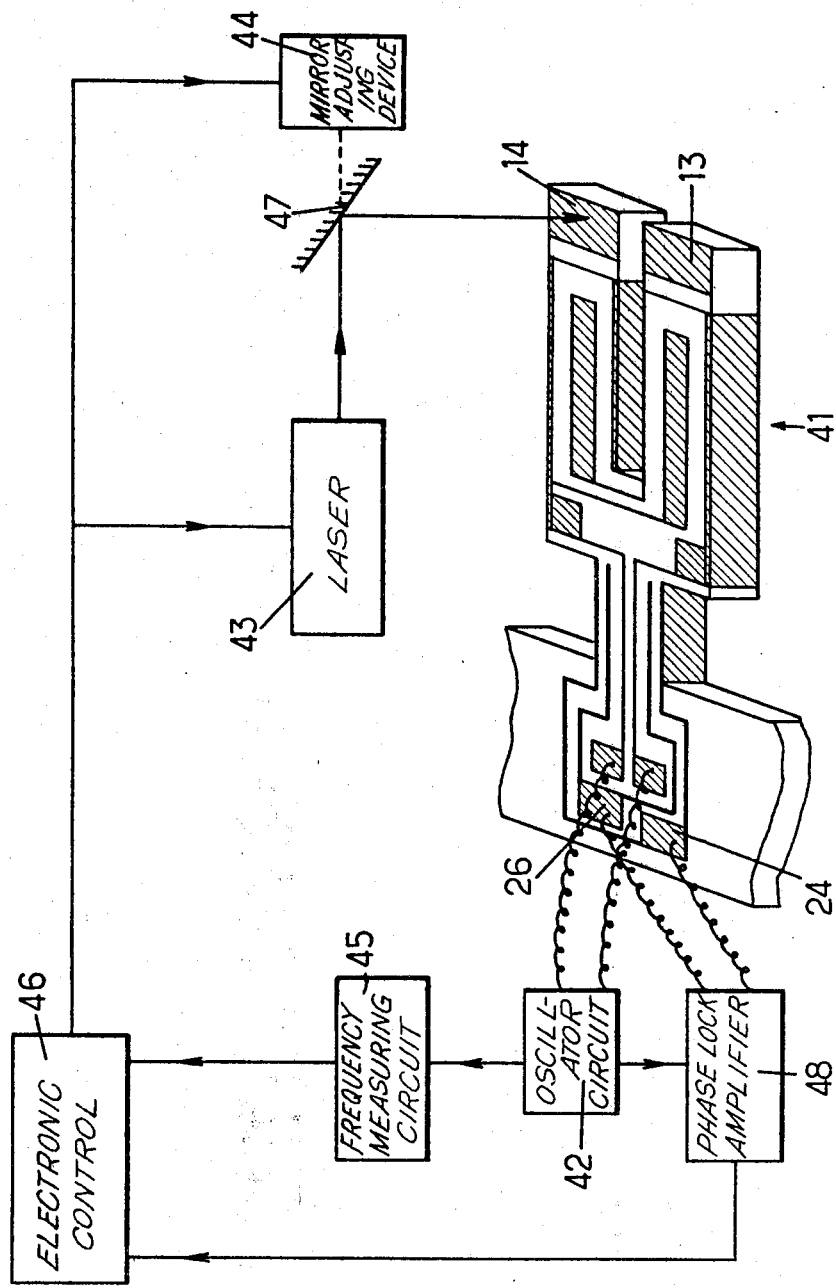
FIG. 5 is a synoptic diagram illustrating an example of the carrying out of the invention involving a detection of asymmetry.

The resonators with which the invention is concerned are constituted essentially by a piezo-electric crystal which is cut in the form of a tuning fork provided with excitation electrodes. Thus, in accordance with FIG. 1, the quartz crystal 1 comprises a median slot which separates two parallel tines 2 and 3, interconnected by a common part constituting the body 4 of the tuning fork. The tuning fork is cut in a plane substantially parallel to the X and Y axes of the crystal. The two tines are perpendicular to the X axis. They are identical to each other and symmetrical with respect to the median plane of the tuning fork, but the invention is not limited to this particular quartz cut. For tuning forks which are cut with different orientations in respect to the axis X, Y and Z, or from a material other than quartz, the auxiliary electrodes may be arranged differently.

The excitation of such a tuning fork necessitates a system of electrodes which creates an electrical field parallel to the X axis. Different electrode systems are known. By way of example, the drawing shows the arrangement according to the British Patent Application No. 1,460,636, although many improvements have been made in this disposition in the course of time, in particular the addition of electrodes on the lateral surfaces of the tines of the tuning fork.

According to FIG. 1, the two tines 2 and 3 carry excitation electrodes on the two principal surfaces of the crystal which are parallel to the plane of the figure, these electrodes being identical to each other and differing only in their electrical connections for the supply of the resonator. These electrodes comprise on each tine a central electrode 5 between two lateral electrodes 6 and 7 which, when in use, are of opposite polarity to that of the central electrode 5. Moreover, there is always inversion of polarity between the two tines, due to the fact that the conductors 8, 9 which are similarly disposed on the surface of the crystal, connect the two lateral electrodes of each tine, together and to the central electrode of the other tine. The conductors likewise ensure the transmission of the supply current from the contact areas 11, 12 disposed on the body 4 of the crystal. On the opposite main surface of the crystal, which is not visible in FIG. 1, the excitation electrodes are disposed exactly symmetrically with respect to the plane of the figure. Holes with metal-coated walls pierced through the crystal in the region of the contact areas 11 and 12 conduct the current between the two main surfaces of the resonator.

The electrodes, contact areas and conductors all are constituted by metallic coatings, comprised in this case of chromium and gold, produced by the usual vacuum evaporation techniques. The auxiliary electrodes which will be described later are produced simultaneously, as are also the supplementary coatings 13 and 14 which are formed on the ends of the tines 2 and 3, and are useful for subsequently adjusting the mass of the tines by removal of material in this region.

Before producing these metallic deposits, when the tuning fork is being formed, several similar tuning forks are cut side-by-side in the same quartz crystal and are kept united to one another throughout the whole of the manufacture. For this purpose each resonator has a stem 15 which is cut in the same crystal as the tuning fork and which is connected to a base 16. This stem will be broken off at the end of the production operation so as to separate the different individual resonators once they are ready for use.

According to FIG. 1, the stem 15 is disposed on the axis of the tuning fork. It is on this stem that the auxiliary electrodes are formed symmetrically with respect to the median plane of the tuning fork. These electrodes are disposed so as to permit the detection of a transverse electric field resulting from deflection stresses transmitted within the crystal from the tines of the tuning fork to the stem 15. They comprise central electrodes 17, 18, two on each of the opposite main surfaces of the crystal, and outside electrodes 19 and 21 located on the lateral surfaces of the stem. Beyond the stem 15, on the base 20 which is common to several resonators, conductors 22 and 23 connect the outside electrodes 19 and 21 to one and the same contact area 24 formed on the base 20. By means of other conductors 25, the two central electrodes 17 and 18 are connected for their part to one and the same contact area 26. The electrodes corresponding to the electrodes 17 and 18 and located on the opposite main surface of the crystal are connected in the same manner to a contact area symmetrical to the area 26 which is itself electrically connected with the latter by means of a hole 27 having a metal-coated wall surface which interconnects them across the crystal.

The electrodes 17 and 18 are sufficiently spaced apart to allow the passage between them of other conductors which connect the contact areas 11 and 12 of the tuning fork with the contact areas 28 and 29, respectively, which are deposited on the base 20 so that they can be used for supplying the resonator during tests made in the course of manufacture. The disposition is identical on both of the main surfaces of the crystal, as shown by FIG. 2.

The resonator shown in FIGS. 3 and 4 is identical to that of FIGS. 1 and 2 in all respects concerning the construction and arrangement of the tuning fork itself. The base 20 is likewise and arranged in a manner similar to that of FIG. 1, and therefore the same reference numerals have been used. The essential difference between these embodiments concerns the connection between the tuning fork 1 and the base 20 and the disposition of the auxiliary electrodes. In the FIG. 3 embodiment, there is no longer provided a single stem, but two separate stems 31 and 32 which are disposed symmetrically, one on each side of the axis of the tuning fork. All the auxiliary electrodes are then located on the lateral surfaces of the stems whereas the main surfaces, on the front and back of the resonator, are reserved for the passage of the conductors 33 and 34 which separately connect the contact areas 11 and 12 of the tuning fork to the contact areas 28 and 29 respectively of the base 20. The auxiliary electrodes comprise two electrodes 35 and 36 on the inner mutually confronting surfaces of the two stems 31 and 32, which are both connected to the allows a determination of which of the two tines must be acted upon for the removal of material in order to obtain a symmetrical tuning fork.

It is also possible to correct the assymetry by selectively depositing material on one tine of the tuning fork. The procedure for depositing the material is in itself conventional and used for adjusting the frequency of tuning forks. In order to be able to correct the assymmetry with the aid of such an apparatus, it is necessary to provide it with the electronic detection and control device shown in FIG. 5. Instead of controlling a mirror